United States Patent
Lu

(10) Patent No.: US 11,705,084 B1
(45) Date of Patent: Jul. 18, 2023

(54) HIGH-SPEED BUFFER AMPLIFIER

(71) Applicant: Himax Technologies Limited, Tainan (TW)

(72) Inventor: Chih-Wen Lu, Tainan (TW)

(73) Assignee: Himax Technologies Limited, Tainan (TW)

(*) Notice: Subject to any disclaimer, the term of this patent is extended or adjusted under 35 U.S.C. 154(b) by 0 days.

(21) Appl. No.: 17/585,087

(22) Filed: Jan. 26, 2022

(51) Int. Cl.
*H03F 3/45* (2006.01)
*G09G 3/36* (2006.01)
*H03F 3/345* (2006.01)
*H03F 3/30* (2006.01)

(52) U.S. Cl.
CPC .......... *G09G 3/3648* (2013.01); *H03F 3/345* (2013.01); *G09G 2310/0291* (2013.01)

(58) Field of Classification Search
CPC .......... G09G 3/3648; G09G 2310/0291; H03F 3/345
USPC .................................................. 330/252–261
See application file for complete search history.

(56) References Cited

U.S. PATENT DOCUMENTS

| | | | |
|---|---|---|---|
| 7,764,121 B2* | 7/2010 | An ................. | H03F 3/4521 330/253 |
| 10,170,992 B1* | 1/2019 | Omole .............. | H03F 3/45475 |
| 11,196,396 B2* | 12/2021 | Liu .................. | H03F 1/52 |

* cited by examiner

*Primary Examiner* — Hieu P Nguyen
(74) *Attorney, Agent, or Firm* — Donald E. Stout; Stout, Uxa & Buyan, LLP

(57) ABSTRACT

A high-speed buffer amplifier includes an input stage including a first channel coupled to receive differential inputs and a second channel coupled to receive the differential inputs; a middle stage including a first current source coupled to receive outputs of the second channel and electrically connected to power, a second current source coupled to receive outputs of the first channel and electrically connected to ground, and a floating current source electrically connected between the first current source and the second current source; and an output stage coupled to the middle stage to generate an output voltage. A shunt circuit is electrically connected between the first current source and the second current source, and configured to bypass the floating current source.

10 Claims, 2 Drawing Sheets

US 11,705,084 B1

HIGH-SPEED BUFFER AMPLIFIER

BACKGROUND OF THE INVENTION

1. Field of the Invention

The present invention generally relates to an amplifier, and more particularly to a high-speed buffer amplifier.

2. Description of Related Art

A liquid-crystal display (LCD) is a type of flat-panel display that presents visual information by modulating liquid crystals (LC) in an LC panel. The LC panel of the LCD is commonly driven by drivers such as a gate driver (or scan driver) and a source driver (or data driver), which are coordinated by a timing controller.

A rail-to-rail class-AB amplifier is usually adapted to the drivers of the LCD as disclosed in "A compact power-efficient 3 V CMOS rail-to-rail input/output operational amplifier for VLSI cell libraries," IEEE Journal of Solid-State Circuits, Volume 29, Issue 12, December 1994, the entire contents of which are hereby incorporated by reference. Low settling time is one of key parameters for guaranteeing the performance of the drivers of the LCD, particularly a large-size or high-resolution LCD. The settling time is defined as the time elapsed from the application of an ideal instantaneous step input to the time at which the amplifier output has entered and remained within a specified error band.

A need has arisen to propose a novel scheme capable of improving settling time of a buffer amplifier adaptable to the LCD.

SUMMARY OF THE INVENTION

In view of the foregoing, it is an object of the embodiment of the present invention to provide a high-speed buffer amplifier with improved settling time.

According to one embodiment, a high-speed buffer amplifier includes an input stage, a middle stage and an output stage. The input stage includes a first channel coupled to receive differential inputs and a second channel coupled to receive the differential inputs. The middle stage includes a first current source coupled to receive outputs of the second channel and electrically connected to power, a second current source coupled to receive outputs of the first channel and electrically connected to ground, and a floating current source electrically connected between the first current source and the second current source. The output stage is coupled to the middle stage to generate an output voltage. The middle stage includes a shunt circuit electrically connected between the first current source and the second current source, and configured to bypass the floating current source.

DETAILED DESCRIPTION OF THE INVENTION

Figure 1:
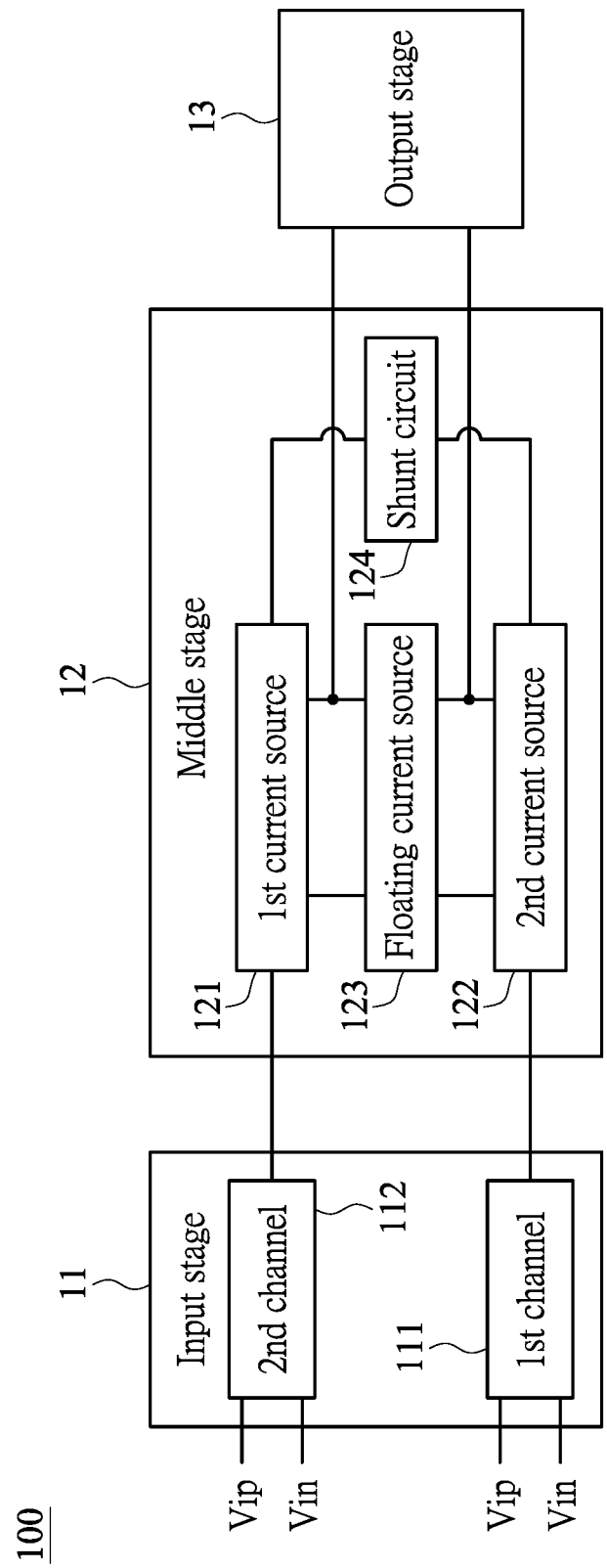
FIG. 1 shows a block diagram illustrating a high-speed buffer amplifier according to one embodiment of the present invention.
Figure 2:
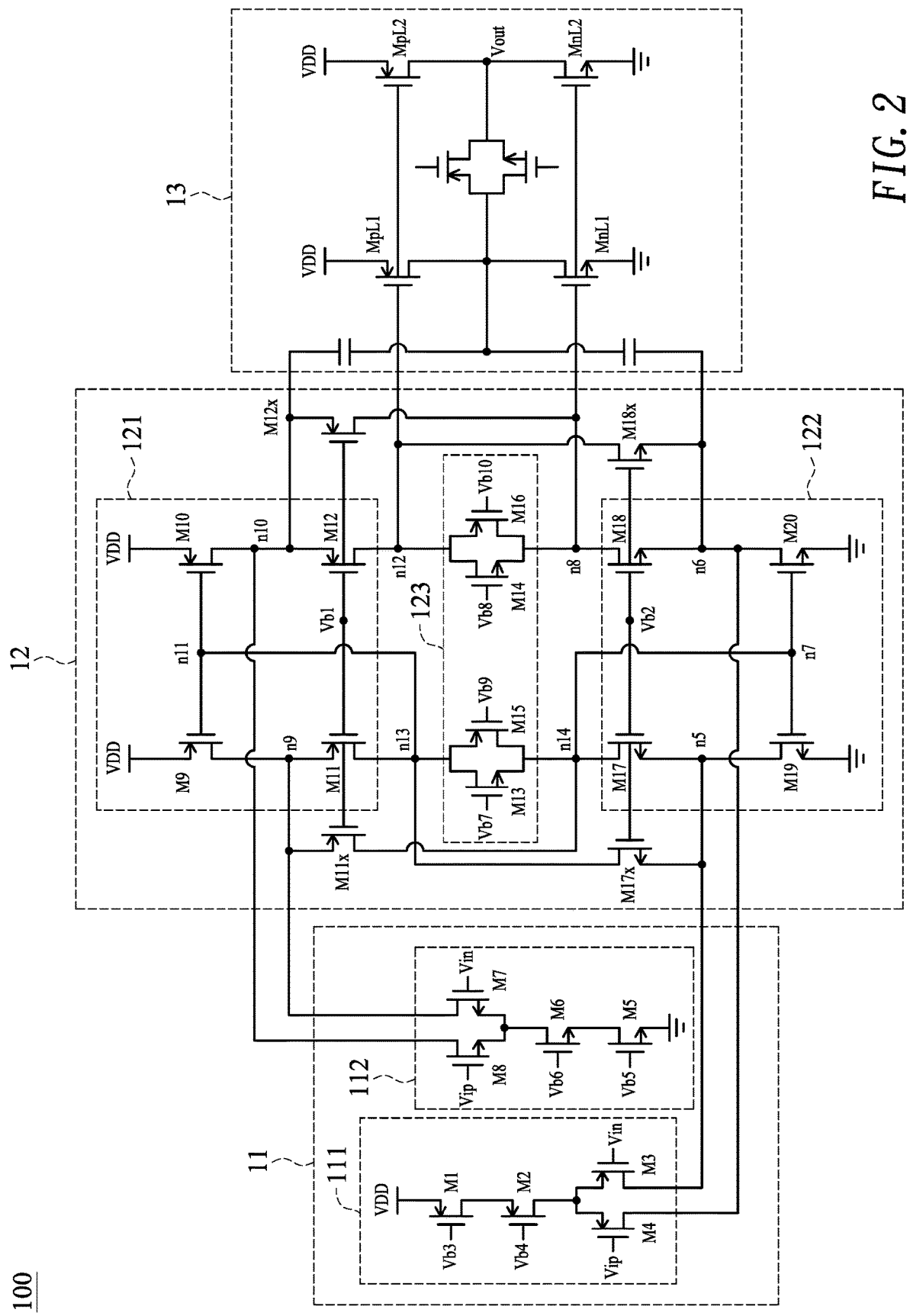
FIG. 2 shows a circuit diagram illustrating the high-speed buffer amplifier of FIG. 1 according to the embodiment of the present invention.

FIG. 1 shows a block diagram illustrating a high-speed buffer amplifier 100 according to one embodiment of the present invention, and FIG. 2 shows a circuit diagram illustrating the high-speed buffer amplifier 100 of FIG. 1 according to the embodiment of the present invention.

In the embodiment, the high-speed buffer amplifier ("amplifier" hereinafter) 100 may include an input stage 11, a middle stage 12 and an output stage 13.

The input stage 11 of the embodiment may include a first channel 111 coupled to receive differential inputs Vip and Vin, and composed of first-type transistors (e.g., P-type metal-oxide-semiconductor (PMOS) transistors) M1-M4. Specifically, the transistors M1-M2 are connected in series (with the transistor M1 coupled to power VDD) to form a first bias branch with bias voltages Vb3-Vb4, and the transistors M3-M4 are connected in parallel with sources connected together to form a first source-coupled differential pair, which is connected to (the transistor M2 of) the first bias branch.

The input stage 11 of the embodiment may include a second channel 112 coupled to receive the differential inputs Vip and Vin, and composed of second-type transistors (e.g., N-type MOS transistors or NMOS transistors) M5-M8. Specifically, the transistors M5-M6 are connected in series (with the transistor M5 coupled to ground) to form a second bias branch with bias voltages Vb5-Vb6, and the transistors M7-M8 are connected in parallel with sources connected together to form a second source-coupled differential pair, which is connected to (the transistor M6 of) the second bias branch.

The middle stage 12 of the embodiment may include a first current source 121 coupled to receive outputs of the second channel 112, and electrically connected to the power VDD. The first current source 121 may include first-type transistors M9-M12. Specifically, the transistors M9 and M11 are connected in series (with the transistor M9 coupled to the power VDD), at a first intermediate node n9, to form a first current branch, and the transistors M10 and M12 are connected in series (with the transistor M10 coupled to the power VDD), at a second intermediate node n10, to form a second current branch. Gates of corresponding transistors of the first and the second current branches are coupled together. For example, gates of the transistors M9-M10 adjacent to the power VDD are coupled at a first coupling node n11, which is further connected to a drain of the transistor M11. It is noted that the first intermediate node n9 and the second intermediate node n10 are connected to drains of the second source-coupled differential pair M7-M8, respectively. The gates of the transistors M11-M12 are coupled to a first bias voltage Vb1.

The middle stage 12 of the embodiment may include a second current source 122 coupled to receive outputs of the first channel 111, and electrically connected to the ground. The second current source 122 may include second-type transistors M17-M20. Specifically, the transistors M17 and M19 are connected in series (with the transistor M19 coupled to the ground), at a third intermediate node n5, to form a third current branch, and the transistors M18 and M20 are connected in series (with the transistor M20 coupled to the ground), at a fourth intermediate node n6, to form a fourth current branch. Gates of corresponding transistors of the third and the fourth current branches are coupled together. For example, gates of the transistors M19-M20 adjacent to ground are coupled at a second coupling node n7, which is further connected to a drain of the transistor M17. It is noted that the third intermediate node n5 and the fourth intermediate node n6 are connected to drains of the first source-coupled differential pair M3-M4, respectively. The gates of the transistors M17-M18 are coupled to a second bias voltage Vb2.

The middle stage 12 of the embodiment may include a floating current source 123 (composed of first-type transistors M15-M16 and second-type transistors M13-M14) electrically connected between the first current source 121 and the second current source 122. Specifically, the transistors M13 and M15 are connected in parallel to form a first floating branch, which is connected between the first current branch M9/M11 (at a first connected node n13) of the first current source 121 and the third current branch M17/M19 (at a second connected node n14) of the second current source 122. The transistors M14 and M16 are connected in parallel to form a second floating branch, which is connected between the second current branch M10/M12 (at a third connect node n12) of the first current source 121 and the fourth current branch M18/M20 (at a fourth connect node n8) of the second current source 122. The gates of the transistors M13-M16 are respectively coupled to corresponding bias voltages Vb7-Vb10. As usual, the gates of the transistors M13-M14/M15-M16 with the same type are coupled to the same bias voltage.

It is noted that the third connect node n12 and the fourth connect node n8 are used as a first output node and a second output node of the middle stage 12, respectively.

According to one aspect of the embodiment, the middle stage 12 may include a shunt circuit 124 electrically connected between the first current source 121 and the second current source 122, and configured to bypass the floating current source 123. The shunt circuit 124 may include a (first-type) first shunt transistor M12x and a (second-type) second shunt transistor M18x. Specifically, a source and a drain of the first shunt transistor M12x are connected to the second intermediate node n10 and the fourth connect node n8 respectively, and the gate connected to the first bias voltage Vb1; and a source and a drain of the second shunt transistor M18x are connected to the fourth intermediate node n6 and the third connect node n12 respectively, and the gate connected to the second bias voltage Vb2. Furthermore, the shunt circuit 124 may include a (first-type) third shunt transistor M11x and a (second-type) fourth shunt transistor M17x. Specifically, a source and a drain of the third shunt transistor M11x are connected to the first intermediate node n9 and the second connect node n14 respectively, and the gate connected to the first bias voltage Vb1; and a source and a drain of the fourth shunt transistor M17x are connected to the third intermediate node n5 and the first connect node n13 respectively, and the gate connected to the second bias voltage Vb2.

Alternatively speaking, the first shunt transistor M12x is connected with the transistor M12 in parallel but bypassing the second floating branch M14/M16; and the second shunt transistor M18x is connected with the transistor M18 in parallel but bypassing the second floating branch M14/M16. Furthermore, the third shunt transistor M11x is connected with the transistor M11 in parallel but bypassing the first floating branch M13/M15; and the fourth shunt transistor M17x is connected with the transistor M17 in parallel but bypassing the first floating branch M13/M15.

As the drain of the first shunt transistor M12x is connected to the fourth connect node n8, instead of connecting to the third connect node n12 as for the transistor M12, signals may pass around the transistors M12 and M16 to promptly affect the fourth connect node n8 (i.e., the second output node of the middle stage 12), thereby accelerating response of the amplifier 100. Similarly, as the drain of the second shunt transistor M18x is connected to the third connect node n12, instead of connecting to the fourth connect node n8 as for the transistor M18, signals may pass around the transistors M18 and M14 to promptly affect the third connect node n12 (i.e., the first output node of the middle stage 12), thereby accelerating response of the amplifier 100.

The output stage 13 of the embodiment is coupled to the first output node and the second output node of the middle stage 12, and configured to generate an output voltage at the output node Vout (of the output stage 13). The output stage 13 may include a first output branch composed of a (first-type) first output transistor MpL1 and a (second-type) second output transistor MnL1 connected in series between the power VDD and the ground. Gates of the first output transistor MpL1 and the second output transistor MnL1 are coupled to the first output node and the second output node of the middle stage 12, respectively.

The output stage 13 of the embodiment may include a second output branch composed of a (first-type) third output transistor MpL2 and a (second-type) fourth output transistor MnL2 connected in series (at the output node Vout of the output stage 13) between the power VDD and the ground. Gates of the third output transistor MpL2 and the fourth output transistor MnL2 are coupled to the first output node and the second output node of the middle stage 12, respectively.

In operation, when a differential input voltage between Vip and Vin increases, the voltage at the second intermediate node n10 accordingly decreases. Consequently, the voltage at the third connect node n12 decreases, and the output voltage at the fourth connect node n8 then decreases. As a result, the voltage at the output node Vout thus increases. It is noted that, owing to the first shunt transistor M12x, some signals may reach the fourth connect node n8 and then promptly affect the output node Vout by passing around the transistors M12 and M16.

On the other hand, when a differential input voltage between Vip and Vin decreases, the voltage at the fourth intermediate node n6 accordingly decreases. Consequently, the voltage at the fourth connect node n8 decreases, and the voltage at the third connect node n12 then decreases. As a result, the output voltage at the output node Vout thus decreases. It is noted that, owing to the second shunt transistor M18x, some signals may reach the third connect node n12 and then promptly affect the output node Vout by passing around the transistors M18 and M14.

Although specific embodiments have been illustrated and described, it will be appreciated by those skilled in the art that various modifications may be made without departing from the scope of the present invention, which is intended to be limited solely by the appended claims.

What is claimed is:

1. A high-speed buffer amplifier, comprising:
an input stage including a first channel coupled to receive differential inputs and a second channel coupled to receive the differential inputs;
a middle stage including a first current source coupled to receive outputs of the second channel and electrically connected to power, a second current source coupled to receive outputs of the first channel and electrically connected to ground, and a floating current source electrically connected between the first current source and the second current source; and
an output stage coupled to the middle stage to generate an output voltage;
wherein the middle stage includes a shunt circuit electrically connected between the first current source and the second current source, and configured to bypass the floating current source, the shunt circuit comprising a first shunt transistor and a second shunt transistor;

wherein the first shunt transistor has one end electrically connected to an output of the second channel and has another end electrically connected to a connect node disposed between the second current source and the floating current source for bypassing the floating current source, and the second shunt transistor has one end electrically connected to an output of the first channel and has another end electrically connected to a connect node disposed between the first current source and the floating current source for bypassing the floating current source.

2. The amplifier of claim 1, wherein the first current source comprises:
a first current branch electrically connected between the power and a first connect node, the first current branch including transistors connected at a first intermediate node; and
a second current branch electrically connected between the power and a third connect node, the second current branch including transistors connected at a second intermediate node.

3. The amplifier of claim 2, wherein the second current source comprises:
a third current branch electrically connected between the ground and a second connect node, the third current branch including transistors connected at a third intermediate node; and
a fourth current branch electrically connected between the ground and a fourth connect node, the fourth current branch including transistors connected at a fourth intermediate node.

4. The amplifier of claim 3, wherein the floating current source comprises:
a first floating branch electrically connected between the first connect node and the second connect node; and
a second floating branch electrically connected between the third connect node and the fourth connect node.

5. The amplifier of claim 4, wherein the shunt circuit comprises:
the first shunt transistor with source and drain connected to the second intermediate node and the fourth connect node respectively; and the second shunt transistor with source and drain connected to the fourth intermediate node and the third connect node respectively.

6. The amplifier of claim 5, wherein the first shunt transistor comprises a P-type metal-oxide-semiconductor (PMOS) transistor, and the second shunt transistor comprises an N-type MOS (NMOS) transistor.

7. The amplifier of claim 4, wherein the shunt circuit comprises:
a third shunt transistor with source and drain connected to the first intermediate node and the second connect node respectively; and
a fourth shunt transistor with source and drain connected to the third intermediate node and the first connect node respectively.

8. The amplifier of claim 7, wherein the third shunt transistor comprises a PMOS transistor, and the fourth shunt transistor comprises an NMOS transistor.

9. The amplifier of claim 3, wherein the first channel comprises:
a first bias branch electrically connected to the power, the first bias branch including transistors connected in series; and
a first source-coupled differential pair including transistors connected in parallel with sources connected together to the first bias branch;
wherein drains of the first source-coupled differential pair are connected to the third intermediate node and the fourth intermediate node respectively.

10. The amplifier of claim 3, wherein the second channel comprises:
a second bias branch electrically connected to the ground, the second bias branch including transistors connected in series; and
a second source-coupled differential pair including transistors connected in parallel with sources connected together to the second bias branch;
wherein drains of the second source-coupled differential pair are connected to the first intermediate node and the second intermediate node respectively.

* * * * *